United States Patent
Naito et al.

(10) Patent No.: US 9,744,698 B2
(45) Date of Patent: Aug. 29, 2017

(54) METHOD FOR MANUFACTURING MICROSCOPIC STRUCTURAL BODY

(75) Inventors: Akihiro Naito, Hiroshima (JP); Kenichi Furuki, Hiroshima (JP); Hiroshi Ito, Hiroshima (JP); Kazutoshi Yakemoto, Hiroshima (JP)

(73) Assignee: THE JAPAN STEEL WORKS, LTD., Tokyo (JP)

( * ) Notice: Subject to any disclaimer, the term of this patent is extended or adjusted under 35 U.S.C. 154(b) by 568 days.

(21) Appl. No.: 13/996,777

(22) PCT Filed: Dec. 1, 2011

(86) PCT No.: PCT/JP2011/077819
§ 371 (c)(1),
(2), (4) Date: Jun. 21, 2013

(87) PCT Pub. No.: WO2012/086385
PCT Pub. Date: Jun. 28, 2012

(65) Prior Publication Data
US 2013/0270743 A1 Oct. 17, 2013

(30) Foreign Application Priority Data
Dec. 22, 2010 (JP) .................................. 2010-286735

(51) Int. Cl.
*B29C 43/02* (2006.01)
*B29C 33/38* (2006.01)
(Continued)

(52) U.S. Cl.
CPC .......... *B29C 43/02* (2013.01); *B29C 33/3857* (2013.01); *B29C 33/424* (2013.01);
(Continued)

(58) Field of Classification Search
CPC ..................................................... B29C 43/02
See application file for complete search history.

(56) References Cited

U.S. PATENT DOCUMENTS

| | | |
|---|---|---|
| 2005/0206034 A1 | 9/2005 | Yokoyama et al. |
| 2007/0138699 A1 | 6/2007 | Wuister et al. |
| | (Continued) | |

FOREIGN PATENT DOCUMENTS

| | | |
|---|---|---|
| CN | 101900936 A | 12/2010 |
| JP | 2006-056107 A | 3/2006 |
| | (Continued) | |

OTHER PUBLICATIONS

Chinese Office Action dated on Dec. 3, 2014, issued by The State Intellectual Property Office of the PR of China in related application No. 201180062519.

(Continued)

*Primary Examiner* — Larry Thrower
(74) *Attorney, Agent, or Firm* — Sughrue Mion, PLLC

(57) ABSTRACT

A method for manufacturing a molded product with fine structure includes steps of, in a temperature-controlled stamper mold provided with a fine structure including a concavo-convex pattern having a width of 10 nm to 1 μm, forming a thermoplastic molten polymer layer to be in contact with the fine structure 20 of the stamper mold having been kept at a predetermined temperature and holding the thermoplastic molten polymer layer for a predetermined time so as to transfer the fine structure of the stamper mold to the thermoplastic molten polymer layer under gravity.

13 Claims, 5 Drawing Sheets

(51) Int. Cl.

| | | |
|---|---|---|
| *B29C 33/42* | (2006.01) | |
| *B29C 39/24* | (2006.01) | |
| *B29C 39/26* | (2006.01) | |
| *B29C 39/42* | (2006.01) | |
| *B29C 41/36* | (2006.01) | |
| *B29C 41/50* | (2006.01) | |
| *B81C 99/00* | (2010.01) | |
| *B29C 43/34* | (2006.01) | |
| *B29C 43/52* | (2006.01) | |
| *B29C 45/26* | (2006.01) | |
| *B29C 43/58* | (2006.01) | |
| *B29C 59/02* | (2006.01) | |

(52) U.S. Cl.
CPC .............. *B29C 39/24* (2013.01); *B29C 39/26* (2013.01); *B29C 39/42* (2013.01); *B29C 41/36* (2013.01); *B29C 41/50* (2013.01); *B29C 43/021* (2013.01); *B29C 43/34* (2013.01); *B29C 43/52* (2013.01); *B29C 45/263* (2013.01); *B81C 99/0085* (2013.01); *B29C 2043/025* (2013.01); *B29C 2043/3438* (2013.01); *B29C 2043/5816* (2013.01); *B29C 2059/023* (2013.01); *B81B 2207/056* (2013.01)

(56) References Cited

U.S. PATENT DOCUMENTS

| | | |
|---|---|---|
| 2007/0243281 A1 | 10/2007 | Hasegawa et al. |
| 2008/0000871 A1 | 1/2008 | Suh et al. |
| 2008/0093764 A1 | 4/2008 | Ito et al. |
| 2010/0089262 A1 | 4/2010 | Seong et al. |
| 2010/0301517 A1 | 12/2010 | Huang |
| 2012/0100339 A1* | 4/2012 | Haynes ................. B29C 43/222 428/141 |

FOREIGN PATENT DOCUMENTS

| | | |
|---|---|---|
| JP | 2007-062372 A | 3/2007 |
| JP | 2007-125799 A | 5/2007 |
| JP | 2007-173806 A | 7/2007 |
| JP | 2009-184275 A | 8/2009 |
| JP | 2009-248431 A | 10/2009 |
| JP | 2010-030045 A | 2/2010 |
| TW | I274654 B | 3/2007 |
| TW | 200833498 A | 8/2008 |
| WO | 2010/041962 A1 | 4/2010 |

OTHER PUBLICATIONS

Taiwanese Office Action dated May 20, 2014, issued by The Intellectual Property Office in counterpart Taiwanese Application No. 100147915.
International Search Report (PCT/ISA/210) issued Feb. 14, 2012, in International Application No. PCT/JP2011/077819.
Written Opinion (PCT/ISA/237), issued Feb. 14, 2012, in International Application No. PCT/JP2011/077819.
Office Action dated Oct. 31, 2014, issued by the Japanese Patent Office in counterpart Japanese Application No. 2012-549706.
Search Report dated Mar. 14, 2017 by the European Patent Office in counterpart European Patent Application No. 11850115.4.

* cited by examiner (a)　　　　　　　　　(b)　　　　　　　　　(c)

(a)　　　　　　　　　(b)

(a)                    (b)

METHOD FOR MANUFACTURING MICROSCOPIC STRUCTURAL BODY

TECHNICAL FIELD

The present invention relates to a method for manufacturing a molded product with fine structure on its surface, which manufactures a molded product having a nano-scaled fine structure transcribed on their surface using a thermoplastic molten polymer, the molded product with fine structure being widely applicable to an injection molding method, an injection compression molding method, a blow molding method, a film sheet molding method using a roller and a thermoplastic molten polymer, and the like.

BACKGROUND ART

A polymer molded product with a fine structure has been increasingly utilized in various fields such as electronic devices, optical devices, recording media, and medical/bio device. Various methods for manufacturing such a molded product with fine structure have been proposed but attention has been attracted to a UV and thermal nanoimprint method owing to high economic efficiency and productivity. Of nanoimprint methods, there is a hot embossing (thermal nanoimprint) method in which a stamper mold is pressed to a polymer substrate softened under heating to cause plastic deformation, thereby transfer-molding a pattern of the stamper mold. The hot embossing method has a high productivity and has advantages such as capability of fabrication of fine patterns of various thermoplastic polymer substrates.

However, the hot embossing (thermal nanoimprint) method has a problem that, in the filling stage of a fine structure of a high aspect ratio, fluidity of a polymer is insufficient or high pressure is needed. Also, the hot embossing method has a problem that, when the polymer is heated to the melting temperature, the fluidity of the polymer exceedingly increases and the polymer substrate only undergoes deformation of extending in a plane direction even when pressed, and thus the polymer is not filled into a deep groove portion of the fine structure at which flow resistance is large. For the problem, for example, PTL 1 proposes a method of manufacturing a molded product with a nano-structure and a micro-structure, which includes a step of placing a powdery polymer on the surface of an original plate, a step of heating the original plate and the polymer to a temperature equal to or higher than the glass transition temperature of the polymer and equal to or lower than the melting temperature, a step of pressing the polymer to the original plate, and a step of removing the original plate after cooling the polymer to a temperature equal to or lower than the glass transition temperature so as to form a reverse structure of the nano-structure and the micro-structure of the original plate.

On the other hand, besides the above-described hot embossing method, there is a UV optical nanoimprint method in which, after a liquid photo-curable polymer is coated on a substrate at room temperature, an optically transparent stamper mold is pressed to the polymer, the polymer is irradiated with a light through the stamper mold to cure the polymer, thereby transcribing a pattern onto the polymer substrate. The UV optical nanoimprint method has advantages that processing can be performed at room temperature, transcribed pressure is low, and a highly accurate pattern can be molded.

However, in the UV optical nanoimprint method, although the pressure for transcription is low, a photo-curable polymer generally exhibits small shrinkage at curing and has properties resemble to an adhesive, so that it is difficult to release the imprinted film polymer from the stamper mold and thus there is a concern that a fine structure of the stamper mold is broken through releasing the imprinted film. For the problem, PTL 2 proposes a manufacture method in which a replica is formed based on a stamper mold original plate and use the replica as a stamper mold in the UV optical nanoimprint step. Namely, PTL 2 proposes a method for manufacturing a polymer-made imprinted film with fine structure having a minimum processing size of 1,000 nm or less, which includes a step of forming a coating film on the surface of a fine structure having a fine concavo-convex pattern of 1,000 nm or less and being composed of a polymer formed by polymerization, a step of pressing the imprinted film with fine structure to a polymer precursor monomer or a composition of a polymer precursor monomer and polymerizing the polymer precursor monomer or the composition of a polymer precursor monomer, and a step of releasing the imprinted film with fine structure from the polymer of the polymer precursor monomer or the composition of a polymer precursor monomer to transfer the fine concavo-convex pattern on the surface of the imprinted film with fine patterns to the polymer.

Further, the UV nanoimprint method is a method of coating an adhesive composed of a UV photo-curable polymer after coating a stamper mold with a polymer, pressing a transparent stamper mold thereto and irradiating it with an ultraviolet ray to cure the adhesive, and subsequently releasing the polymer together with the transparent stamper mold from the stamper mold to thereby stamp a imprinted film with fine pattern. Therefore, the method has problems that the number of steps is large and thus the production costs increase. For this problem, PTL 3 proposes a method for transferring a fine structure, which includes a step of coating a solvent on a surface of a stamper mold having a fine structure, a step of bringing a polymer substrate into contact with the solvent on the stamper mold, and a step of releasing the stamper mold from the polymer substrate.

PTL 4 proposes a method for transcribing a molded fine structure not by heating and softening a polymer substrate but using a molten polymer. Namely, PTL 4 proposes a method for manufacturing a molded product, which includes coating a molten polymer on a stamper mold having fine concavity and convexity, pressing it, and subsequently cooling and solidifying it to obtain a molded product having a fine concavo-convex transfer-molded thereto, wherein the feed of the molten polymer onto the stamper mold having the fine concavo-convex pattern on its surface is performed so that the shape and thickness are almost close to those of a final molded product with moving a molten polymer discharge port and the moltenc polymer is attached to the inside of the fine concavo-convex pattern. According to the method for manufacturing a molded product, it is said that a molded product where the shape of the fine concavo-convex pattern has a width or diameter of 10 nm to 1 mm and a depth or height of 10 nm to 1 mm can be manufactured.

PTL 5 proposes a method of coating a thermoplastic polymer using a T die on a surface to be coated having a fine pattern in a predetermined thickness with relatively moving the surface to be coated and the discharge port, and subsequently and immediately pressing the coated polymer with a pressurizing roller with maintaining a condition that attaching force between the polymer and the pressurizing roller is lower than attaching force between the polymer and a mold, so as to accelerate the filling of the polymer coated on the surface to be coated into the fine pattern and also achieve flatness of the thickness of the coated polymer and transcription of a mirror surface to the upper surface.

CITATION LIST

Patent Literature

PTL 1: JP-A-2010-30045
PTL 2: JP-A-2009-184275
PTL 3: JP-A-2007-125799
PTL 4: JP-A-2006-56107
PTL 5: JP-A-2009-248431

SUMMARY OF INVENTION

Technical Problem

As shown in the above, the related-art methods for manufacturing a molded product with fine pattern described in PTLs 1 to 5 except for PTL 3 are methods of performing transfer molding by pressing a heated polymer substrate or a molten polymer to a stamper mold having a fine structure. In such methods requiring pressurization of a stamper mold, in a stamper mold having a nano-scaled fine structure, there is a concern of breaking the stamper mold to a degree more than the degree described in PTL 2. On the other hand, recently, in electronic devices, optical devices, recording media, bio devices, and the like, it is attempted to further improve its functionality by a molded product with fine nanostructure, so that there is a demand for a manufacturing method capable of manufacturing a molded product with fine nanostructure stably using various materials.

The method for manufacturing a molded product with fine structure described in PTL 3 is a method of performing transcription of the fine structure of a stamper mold by dissolving the surface layer of the polymer substrate on the stamper mold side and filling the dissolved polymer into the fine structure. This method has an advantage that the stamper mold is not broken because a load on the stamper mold is only the weight of the polymer substrate. However, this method has many problems such that the kind of the applicable polymer is limited since it is necessary to find out a solvent capable of dissolving the surface layer of the polymer substrate for each kind of the polymer, it is necessary to develop a special solvent that is compatible to the kind of the polymer to be used depending on the situation, treatment facilities for discharge of the solvent and splashing suppression thereof are necessary, and accuracy and homogeneity in transcription are problematic.

In view of such related-art problems and demands, an object of the present invention is to provide a method for manufacturing a molded product with fine structure, which can transcribe a fine structure using various thermoplastic molten polymers without particularly requiring a pressurization apparatus, which can prevent breakage of a stamper mold, and which can afford a molded product with fine nanostructure exhibiting a high economical efficiency and having a large area and homogeneous properties.

Solution to Problem

A method for manufacturing a molded product with fine structure according to the invention comprises steps of: in a temperature-controlled stamper mold having a fine structure comprising a concavo-convex pattern having a width of 10 nm to 1 μm, forming a thermoplastic molten polymer layer to be in contact with the fine structure of the stamper mold having been kept at a predetermined temperature; holding the thermoplastic molten polymer layer for a predetermined time so as to transcribe the fine structure of the stamper mold to the thermoplastic molten polymer layer under gravity; cooling and solidifying the transcribed thermoplastic molten polymer layer; and subsequently releasing the solidified thermoplastic molten polymer layer from the stamper mold.

Further, there may be provided a method for manufacturing a molded product with fine structure, comprising steps of: in a temperature-controlled stamper mold having a fine structure comprising a concavo-convex pattern having a width of 10 nm to 1 μm, forming a thermoplastic molten polymer layer to be in contact with the fine structure of the stamper mold having been kept at a predetermined temperature; holding the thermoplastic molten polymer layer for a predetermined time so as to transcribe the fine structure to the thermoplastic molten polymer layer under gravity; cooling and solidifying the transcribed thermoplastic molten polymer layer by temperature control of the stamper mold together with a mold brought into contact with a back surface of the thermoplastic molten polymer layer from the stamper mold; and subsequently releasing the solidified thermoplastic molten polymer layer from the stamper mold. In this manufacturing method of the molded product with fine structure, it is preferable that pressurization force at the time when the mold is brought into contact with the back surface of the molten polymer layer from the stamper mold is 0.1 to 40 MPa.

Still further, there may be provided a method for manufacturing a molded product with fine structure, comprising steps of: in a temperature-controlled stamper mold provided with a fine structure comprising a fine pattern in which width of a concavo-convex pattern is nano-sized and a fine pattern in which width of a concavo-convex pattern is micro-sized, forming a thermoplastic molten polymer layer to be in contact with the fine structure of the stamper mold having been kept at a predetermined temperature; first, holding the thermoplastic molten polymer layer for a predetermined time so as to transcribe the nano-sized fine pattern to the thermoplastic molten polymer layer under gravity; second, pressurizing the thermoplastic molten polymer layer so as to transcribe the micro-sized fine pattern to the thermoplastic molten polymer layer to completely transcribe the fine structure; then, cooling and solidifying the completely transcribed thermoplastic molten polymer layer; and subsequently releasing the solidified thermoplastic molten polymer layer from the stamper mold.

Still further, there may be provided a method for manufacturing a molded product with fine structure, comprising steps of: in a temperature-controlled stamper mold provided with a fine structure comprising a fine pattern in which width of a concavo-convex pattern is nano-sized and a fine pattern in which width of a concavo-convex pattern is micro-sized, forming a thermoplastic molten polymer layer to be in contact with the fine structure of the stamper mold having been kept at a predetermined temperature; first, pressurizing the thermoplastic molten polymer layer so as to transcribe the micro-sized fine pattern to the thermoplastic molten polymer layer; second, holding the polymer layer for a predetermined time so as to transcribe the nano-sized fine pattern to the thermoplastic molten polymer layer to completely transcribe the fine structure; then, cooling and solidifying the completely transcribed thermoplastic molten polymer layer; and subsequently releasing the solidified thermoplastic molten polymer layer from the stamper mold.

In the above-described invention, the formation of the molten polymer layer is performed by coating a thermoplastic molten polymer on an upper surface of the fine structure of the stamper mold under a coating pressure of 2 MPa or less so that a thickness of the polymer to be coated is determined by a distance between a polymer discharge port and the stamper mold and the shape and a thickness of the molten polymer layer become about the same as those of the transcribed final molded product with fine structure.

Advantageous Effects of Invention

The method for manufacturing a molded product with fine structure of the invention can economically manufacture a molded product with fine structure containing a concavo-convex pattern having a width of 10 nm to 1 µm in high productivity without requiring pressurization. Moreover, according to the invention, it is possible to manufacture a molded product with fine structure which has a large area, which is rich in homogeneity, and which does not have internal strain, birefringence, and orientation. Further, it is possible to manufacture a molded product with fine structure having a fine structure having a width of about 10 nm and a high aspect ratio (height of pattern/width or diameter thereof) can be manufactured. Furthermore, since it is possible to perform the molding with no pressurization, damages such as abrasion and breakage of the fine structure of a stamper mold are little, so that the life of the stamper mold can be lengthened.

Moreover, since the manufacturing method of the invention is not particularly limited even when the stamper mold having a fine structure is in any form, the method can be used in various molding methods that utilize a thermoplastic molten polymer and a stamper mold with which the thermoplastic molten polymer comes into contact. The manufacturing method of the invention can be used, for example, in an injection molding method, an injection compression molding method, a blow molding method, and a film sheet molding method using a roller and a thermoplastic molten polymer.

Furthermore, since the manufacturing method of the invention can use a thermoplastic polymer in a pellet form, which is widely and commonly commercially available, room for choice of materials is extremely broad and costs are low. Therefore, the manufacturing method of the invention has an advantage that complicated steps required in the methods using a polymer substrate, e.g., steps of selection of the kind and grade of the polymer, primary processing into a sheet form or a film form, and the like for satisfying various properties required for the molded product with fine structure are not necessary.

BRIEF DESCRIPTION OF DRAWINGS

FIG. 1(a) shows a state that a thermoplastic molten polymer layer being in contact with a fine structure of a stamper mold is formed, and FIG. 1(b) is an enlarged view showing a state that the molten polymer is filled into a concave fine structure. FIG. 1(c) shows a state that transfer is completely performed.

FIG. 2(a) is an example of a stamper mold in which fine conical protrusions stand together in large numbers, and FIG. 2(b) is an example of a stamper mold in which fine cylindrical protrusions stand together in large numbers.

DESCRIPTION OF EMBODIMENTS

Figure 1:
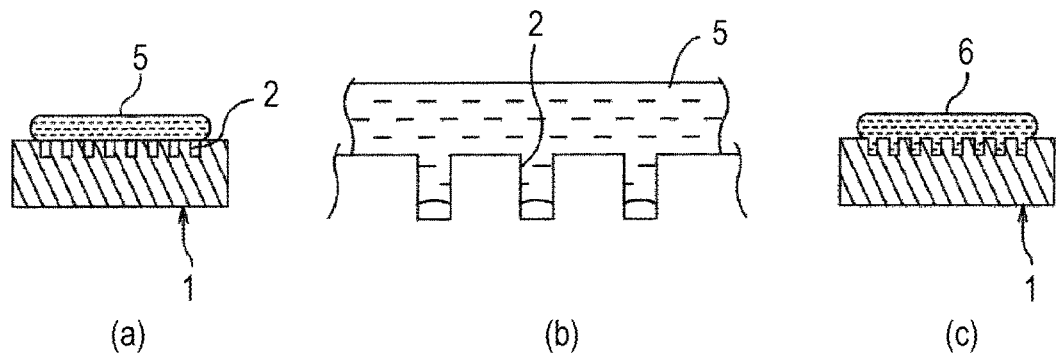
FIG. 1 is a schematic view illustrating the method for manufacturing a molded product with fine structure according to the invention.

The following will explain modes for carrying out the invention. The method for manufacturing a molded product with fine structure according to the invention is performed as shown in FIG. 1. Namely, in the method for manufacturing a molded product with fine structure according to the invention, as schematically shown in FIG. 1(a), in a stamper mold 1 provided with a fine structure 2 including a concavo-convex pattern having a width of 10 nm to 1 µm and temperature-controlled, first, a thermoplastic molten polymer layer 5 being in contact with the fine structure 2 of the stamper mold 1 having been kept at a determined temperature is formed. Next, the fine structure 2 is transferred to the thermoplastic molten polymer layer 5 under gravity by holding the state for a predetermined time and the transfer-molded thermoplastic molded product with fine structure is cooled and solidified (FIG. 1(c)). Then, the cooled and solidified molded product with fine structure 6, to which the fine structure 2 is completely transfer-molded, is released from the stamper mold 1. FIG. 1(b) shows a midstream state of filling of the thermoplastic molten polymer layer 5 into the fine structure 2 and proceeding of transfer. The filling of the thermoplastic molten polymer layer 5 into the concave pattern is observed such that the molten polymer penetrates into the concave pattern as shown in FIG. 1(b).

In the invention, the fine structure including a concavo-convex pattern having a width of 10 nm to 1 μm may be a fine structure composed of only a concave pattern or a convex pattern having a width of 10 nm to 1 μm, or may be a fine structure composed of at least one concave pattern or convex pattern having a width of 10 nm to 1 μm and a concave pattern or a convex pattern having a size (several μm to several hundred μm or further 1 mm) larger than the above size.

Figure 2:
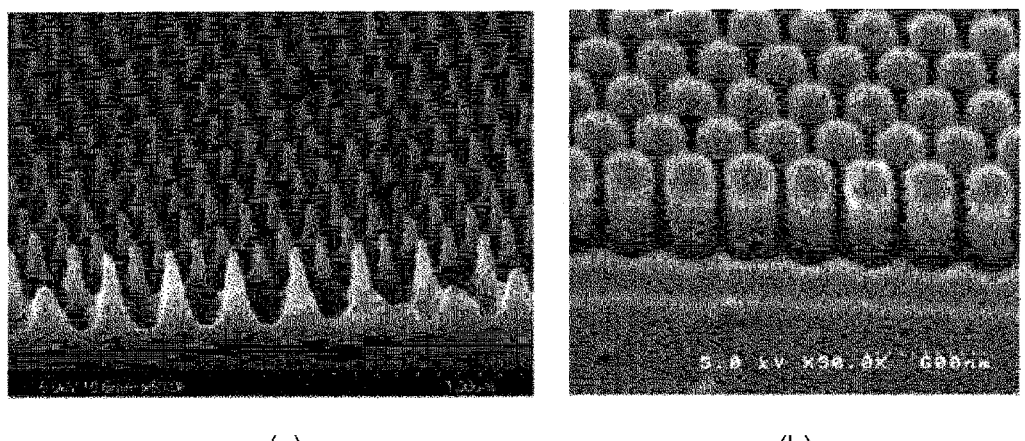
FIG. 2 is a view showing an example of a fine structure containing a concavo-convex pattern having a width of 10 nm to 1 µM.

The concavo-convex pattern having a width of 10 nm to 1 μm refers to a concave pattern composed of a hole or groove having a width of 10 nm to 1 μm formed on the stamper mold as shown in FIG. 1 or a convex pattern (a fine protrusion) having a diameter or side length of 10 nm to 1 μm as shown in FIG. 2, and means a concavo-convex pattern where fine gaps and spaces having a width of 10 nm to 1 μm, into which the coated molten polymer is configured to penetrate (permeate), are formed. FIG. 2(a) is an example of a stamper mold in which fine conical protrusions stand together in large numbers, and FIG. 2(b) is an example of a stamper mold in which fine cylindrical protrusions stand together in large numbers. As shown in FIG. 2, in the case where fine protrusions stand together in large numbers, concave groove-like spaces having a width of 10 nm to 1 μm are formed between the alignments of the fine protrusions or concave spaces of 10 nm to 1 μm are formed surrounded with neighboring fine protrusions, and the molten polymer being filled into such fine spaces.

The invention defines width size of the concavo-convex pattern as 10 nm to 1 μm. The value of 10 nm corresponds to radius of gyration, which shows spatial expanse of a polymer chain, and is a size at which shape retention of a fine structure after transfer becomes difficult depending on the kind of the polymer. Thus, there may be a case where transfer molding is not well performed at a width of less than 10 nm. Therefore, in the invention, the width size is defined as 10 nm or more at which the shape retention of the fine structure after transfer is possible in many polymers. Namely, the width of 10 nm is a measure judged from the viewpoint of the shape retention of the fine structure after transfer. Thus, depending on the kind of the polymer, there may be a case where a fine structure can be manufactured by the manufacturing method of the invention even when it is a fine structure having a width of less than 10 nm.

In the invention, as the stamper mold, it is possible to use one that is capable of temperature control directly or through a mold. Further, as the stamper mold, metal-made one, for example, nickel alloy-made one can be used. Furthermore, as the stamper mold, one made of another material such as silicon or quarts, UV-curable resin-made one, and the like can be used.

As a heating means of the stamper mold, for example, a heater, a thermal medium such as oil, hot water, silicone, or steam, or a combination thereof can be used. As a cooling means of the stamper mold, for example, cold water can be used.

As the predetermined temperature at which the stamper mold is held, an optimum condition is selected depending on the kind of the polymer to be used, the size, shape, and disposition of the fine structure, and the like. Moreover, the stamper mold where the molten polymer layer of a thermoplastic polymer being in contact with the fine structure is formed is held at a predetermined temperature and is held for a predetermined time. The predetermined time to be held is selected depending on the kind of the polymer to be used, the size, shape, and disposition of the fine structure, and the like.

Figure 3:
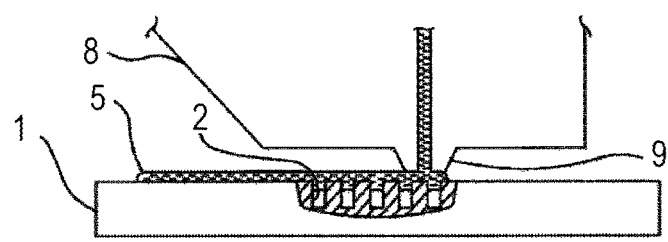
FIG. 3 is a schematic view showing a state that a thermoplastic molten polymer layer is formed by means of a coating apparatus having a T die.

The formation of the molten polymer layer is not particularly limited as far as the method can form a molten polymer layer having a predetermined even thickness, but a film-shaped molten polymer layer having an even thickness can be suitably formed by using a T die. FIG. 3 shows a state that a thermoplastic molten polymer layer 5 is formed by coating a molten polymer to a stamper mold 1 having a fine structure by means of a coating apparatus 8 having a T die.

In the coating by T die, it is preferable to perform the coating of the molten polymer so that shape and thickness almost close to those of a transfer-molded final molded product with fine structure are achieved by performing the coating such that the thickness of the polymer to be coated is defined by the distance between the polymer discharge port 9 and the stamper mold 1 with relatively moving the polymer discharge port 9, which is provided on the T die, and the stamper mold 1, which includes the fine structure. In the case of using the coating apparatus 8 having a T die, not only the thickness of the molten polymer to be coated can be easily controlled but also the molten polymer can be coated so as to be closely appressed to the stamper mold 1 and can be homogeneously coated on a large area. According thereto, highly accurate transfer molding can be performed.

In the invention, the coating of the thermoplastic polymer is appropriately carried out with loading a coating pressure of 2 MPa or less as a gauge pressure on the upper surface of the molten polymer to be coated. Such coating can be suitably performed using the above T die. By imparting the coating pressure to the molten polymer, not only large part of air in the interface between the molten polymer to be coated and the stamper mold can be excluded but also entrainment of air into the molten polymer can be prevented, and further, entrained air can be discharged. As the degree of the coating pressure, an optimum degree is selected depending on the size, shape, and disposition of the fine structure or the kind of the polymer to be handled and the thickness of the molten polymer to be coated. For example, in the case where a molded product with fine structure of a polycarbonate is molded using a stamper mold having a fine structure having a conical shape having a diameter of the bottom of about 100 nm and a height of 325 nm and has a pitch between cones of 250 nm as shown in FIG. 2(a), the coating pressure is preferably about 0.05 MPa.

In the invention, as described above, a molten polymer layer being in contact with the fine structure is formed. On this occasion, the molten polymer layer becomes in a state that it is appressed to the stamper mold, so that adhesive force is generated between the layer and the stamper mold. Since the adhesive force is larger than thermal stress of the molten polymer generated under an extremely small Young's modulus (thermal stress generated through a decrease in the temperature of the molten polymer until the temperature of the heated stamper mold), the molten polymer layer is constrained on the place. As a result, the molten polymer layer can closely appress to the stamper mold homogeneously over a large area, and it becomes possible to transfer uniform concavity and convexity having a width of 10 nm to 1 μm over the whole surface being in contact therewith. Specifically, in the method of performing coating with a T die, since the molten polymer discharged from the polymer discharge port immediately reaches the stamper mold, it becomes possible to bring the molten polymer into contact with the stamper mold extremely stably over the whole coated range from reasons of: (i) no decrease in temperature until it reaches; and (ii) no generation of strain caused by flow since the molten polymer is not allowed to flow on the stamper mold, and the like.

Moreover, in the invention, the fine structure provided on the stamper mold is transferred to the thermoplastic molten polymer layer under gravity. The term "under gravity" means that pressurization by a pressurization apparatus or the like is not applied so that no pressure is applied there, and means that the molten polymer is spontaneously filled under gravity. The reason why the molten polymer is filled into the concavo-convex pattern having a width of 10 nm to 1 μm despite of no pressurization is considered to be that, since resistance required for flow deformation is extremely low due to fluidity, wettability, low elastic modulus, and the like possessed by the molten polymer, the molten polymer is easily and sufficiently filled into the concavo-convex pattern having a width of 10 nm to 1 μm with time by the action of surface tension and sliding properties of the stamper mold.

Thus, in the invention, since the filling of the molten polymer into the concavo-convex pattern having a width of 10 nm to 1 μm is performed under no pressurization, even in the case of a fine structure composed of fine protrusions having a diameter or side length of 10 nm to 1 μm provided on the stamper mold, the breakage and abrasion thereof can be prevented. Therefore, breakage and abrasion of the fine protrusions by pressurization force as in the related-art transfer-molding methods are not observed, according to the invention. Accordingly, even in the case of a stamper mold having a fine structure having fine protrusions having a diameter or side length of 10 nm to 1 μm and having an aspect ratio of 1 to 10 or more, the life of the stamper mold according to the invention can be lengthened. Therefore, according to the invention, a molded product with fine structure having such a fine structure can be manufactured in high quality (sharp edge, high transfer ratio, no defective product at release, and the like) and high economical efficiency.

Moreover, in the invention, since the transfer molding is performed under no pressurization, uniform transfer molding is achieved. Therefore, according to the invention, not only inner strain and orientation of the molded product with fine structure, which are prone to occur during transfer molding, can be prevented but also a large area molded product with fine structure having no birefringence that is an optical strain can be molded. Therefore, the invention does not have the following problems possessed by the method of transfer molding by pressing a molten polymer: a problem that pressurization force varies depending on places and thus homogeneous pressurization is impossible since a portion high in height is preferentially pressurized when warp and waving are present on the stamper mold surface; or a problem that, when a portion high in height is preferentially pressurized during the pressing of the molten polymer, the molten polymer at the pressurized portion flows toward a portion low in height to orient the polymer chain and thus a strain is generated in the molded product with fine structure.

Moreover, since the filling and transfer molding of the molten polymer layer into the fine structure including the concavo-convex pattern having a width of 10 nm to 1 μm are performed by temperature control of the stamper mold and holding time thereof under no pressurization, the invention can be widely carried out. For example, the invention can be carried out using various ones such as stamper molds having a fine structure different in the kind of polymers, grade of polymers, size, shape, and disposition, stamper molds different in disposition of pattern area in which the fine structure is processed, or stamper molds different in material. Furthermore, the invention can be carried out, for example, in an injection molding method, an injection compression molding method, a blow molding method, or a film sheet molding method without limitation to various molding methods.

In the invention, the molten polymer layer is held in a state that the layer is in contact with the stamper mold kept at a predetermined temperature for a predetermined time, as described above. The predetermined temperature varies depending on various properties such as fluidity and elastic modulus of the polymer, the size, shape, or disposition of the fine structure, the material or surface properties of the stamper mold, or the like, as shown in the following Examples.

The predetermined time means a certain period of time for which the molten polymer layer is in contact with the stamper mold after the molten polymer layer to be in contact with the stamper mold having been kept at the predetermined temperature is formed. The predetermined time varies depending on various properties such as fluidity and elastic modulus of the polymer, the size, shape, or disposition of the fine structure, the material or surface properties of the stamper mold, or the like.

In the invention, the molten polymer to be coated to the stamper mold is not limited in the kind or grade thereof as far as it is a thermoplastic polymer. For example, various polymers such as polycarbonate, polymethylmethacrylate, polystyrene, polyethylene terephthalate, polyethylene naphthalate, cycloolefin polymers, polypropylene, polyethylene, and polyglycolic acid can be used. In the coating of the molten polymer, the molten polymer layer can be suitably formed using a coating apparatus having a T die.

EXAMPLES

Hereinafter, Examples of the invention will be described. Incidentally, the invention is not limited to the following Examples.

Using a Micro-nano Melt Transcription Molding Machine MTM II 130-30 (manufactured by The Japan Steel Works Ltd.), a transfer molding test of a fine structure was performed. In the present test, as shown in FIG. 3, a molten polymer layer was formed by coating a molten polymer to a stamper mold by means of a coating apparatus having a T die. The following shows main experimental conditions. As polymers used, two kinds (a low flowability type and a high flowabiliy type) of polymethylmethacrylate and a polycarbonate, e.g., three kinds in total were used.

(i) Unit for plasticization/injection of polymer: an injection unit 30H (cylinder diameter φ: 20 mm) manufactured by The Japan Steel Works Ltd.

(ii) T die: a T die whose polymer discharge port has a shape of a width of 50 mm×a gap of 0.5 mm (iii) Driving apparatus: a driving mechanism that can move the plasticization/injection apparatus and the T die mounted on its front edge horizontally and vertically.

(iv) Used polymers

1) A low flowability type polymethylmethacrylate (PARAPET EH1000 manufactured by Kuraray Co. Ltd.)

2) A high flowability type polymethylmethacrylate (PARAPET GH1000S manufactured by Kuraray Co. Ltd.)

3) A polycarbonate (Panlite AD5503 manufactured by Teijin Chemicals Ltd.)

Figure 5:
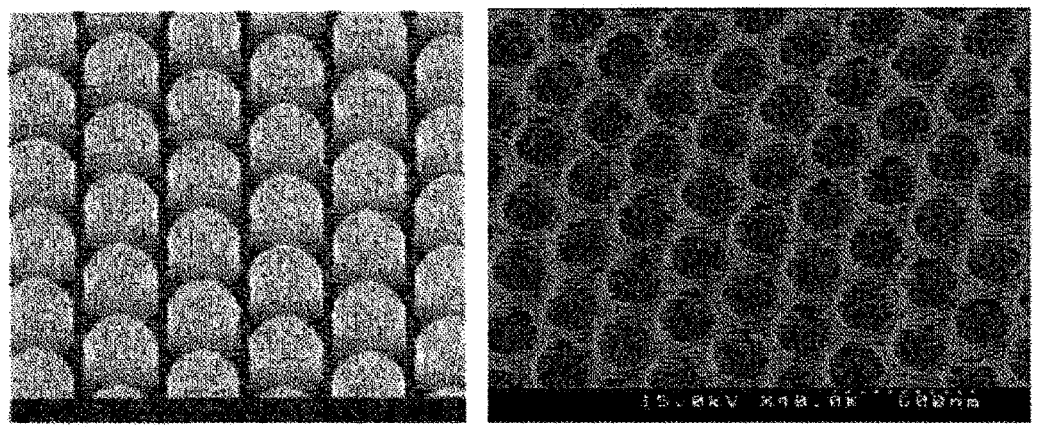
FIG. 5 shows SEM images of: (a) a fine structure of the stamper mold; and (b) a fines structure of a transfer-molded product.

As a stamper mold, nickel alloy-made one was used. With regard to the shape of the stamper mold, outer size was as follows: length 70 mm×width 70 mm×thickness 0.5 mm. The fine structure fabricated on the stamper mold was a pattern in which columns each having a diameter of 250 nm and a height of 250 mm were regularly aligned at a gap of a minimum gap of 60 nm in a staggered form as shown in FIG. 5(a). The maximum size of concave pattern of the fine structure formed by these columns becomes 250 nm.

The shape of the molten polymer layer formed by coating had a width of 50 mm, a length of 52.5 mm, and a thickness of 0.2 mm. The outer size of the molten polymer layer can be chiefly determined by the width of the T die, the length of coating, and the thickness of the coated molten polymer.

In order to prevent moisture absorption of the polymer, drying was performed in an oven before molding. The polymethylmethacrylate was dried at 80° C. and the polycarbonate was dried at 120° C. for 5 hours or more. Moreover, at the time of molding, the polymer was charged into the plasticization/injection apparatus using a material-feeding apparatus fitted with a heating function to prevent moisture absorption of the polymer. Furthermore, decomposition of the polymer was prevented by introducing nitrogen into the polymer charging port of the plasticization/injection apparatus to make the inside of the plasticization/injection apparatus nitrogen atmosphere.

The set temperature of the cylinder front edge and the T die of the plasticization/injection apparatus was controlled to 265° C. for PARAPET EH1000, 255° C. for PARAPET GH1000S, and 265° C. for Panlite AD5503. The polymer pellets charged into the plasticization/injection unit were plasticized by the heat transferred from a heater mounted on an outer circumstance of the cylinder and shear heat generation resulting from the rotation of screws and the molten polymer was pooled at the front edge portion of the screws in the cylinder in only an amount necessary for coating, by moving the screws backward under rotation. Then, the molten polymer pooled at the front edge portion of the screws was extruded from the polymer discharging port of the T die by moving the screws forward and was coated to the stamper mold.

The coating of the molten polymer to the stamper mold is performed by moving the polymer discharging port of the T die to a coating start position on the stamper mold by means of a driving apparatus, bringing the distance between the polymer discharging port of the T die and the stamper mold close to an objective coating thickness, subsequently moving the T die by means of the driving apparatus, and simultaneously injecting the polymer from the polymer discharging port of the T die with moving the screws of the plasticization/injection apparatus forward. Here, the advancing speed of screws of the plasticization/injection apparatus is set so that a flow rate m³/s calculated from the expression [Width (m) of polymer discharging port of T die×Moving velocity (m/s) of T die×Coated thickness (m) a distance between the polymer discharging port of the T die and the stamper mold in a vertical direction)] becomes equal to the flow rate of the molten polymer discharged from the polymer discharging port of the T die.

The above stamper mold was fixed to a base mold having a heating/cooling mechanism and the temperature of the stamper mold was controlled by heating or cooling the base mold to a desired temperature. The heating of the base mold was performed by means of an electric heater built in the base mold and by passing a heated water through a medium flow channel fabricated in the base mold. The cooling was performed by passing a cold water through the medium flow channel. In the present Example, the heating of the stamper mold was completed before the molten polymer was coated. The test was performed with changing the setting of the mold temperature in the range of 160° C. to 180° C. in the case of PARAPET EH1000, 155° C. to 175° C. in the case of PARAPET GH1000S, and 160° C. to 180° C. in the case of Panlite AD5503.

After each polymer in a molten state was coated on the stamper mold heated to the above each temperature, it was held for a predetermined time. The holding time was taken as an elapsed time after the coating of the molten polymer was completed and the stamper mold was cooled from the time point when the set time had passed. In the present Example, the setting of the holding time was changed between 0 s and 360 s.

Figure 4:
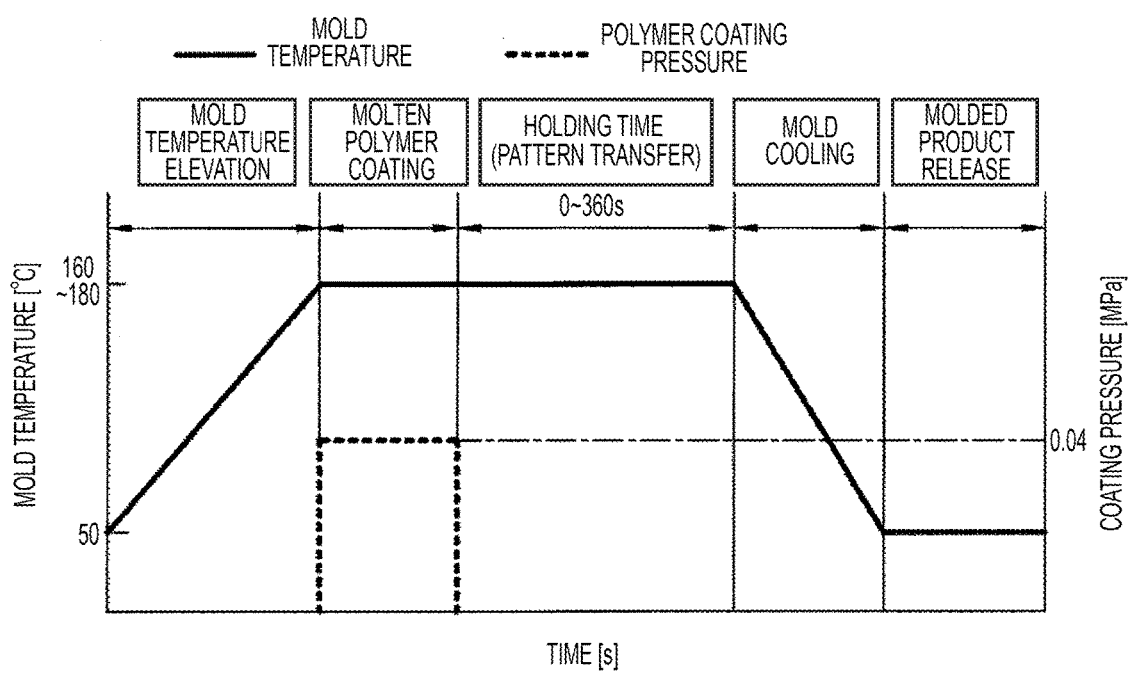
FIG. 4 is a graph showing summary of history of temperature control of the stamper mold and imparted pressure by the invention.

FIG. 4 schematically shows a temporal history of the mold temperature and the coating pressure at coating in each step when transfer molding was performed using Panlite AD5503. The release of the stamper mold from the transfer-molded molded product with fine structure was performed after the stamper mold was cooled to 50° C., as shown in FIG. 4.

FIG. 5(b) shows an SEM image of the fine structure transferred to a molded product obtained by cooling after Panlite AD5503 heated to 175° C. was coated on a stamper mold having a fine structure shown in FIG. 5(a) and held for 15 s. From FIG. 5(b), according to the manufacturing method of the invention, it is clearly understood that the polymer is sufficiently filled between pillars of a gap of 60 nm×a depth of 250 nm and thus the fine structure of the stamper mold is accurately transferred.

Figure 6:
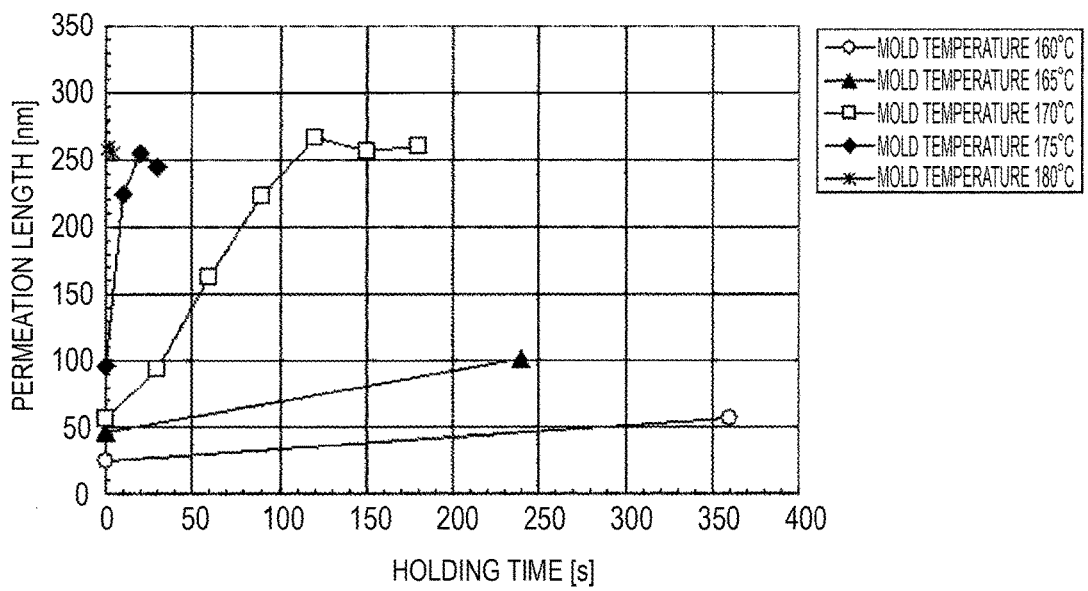
FIG. 6 is a graph showing results of relationship between elapsed time after coating of Panlite AD5503 (polycarbonate polymer) and permeation length thereof tested at some mold temperatures in a case where the polymer is coated to a stamper mold and brought into contact therewith.
Figure 7:
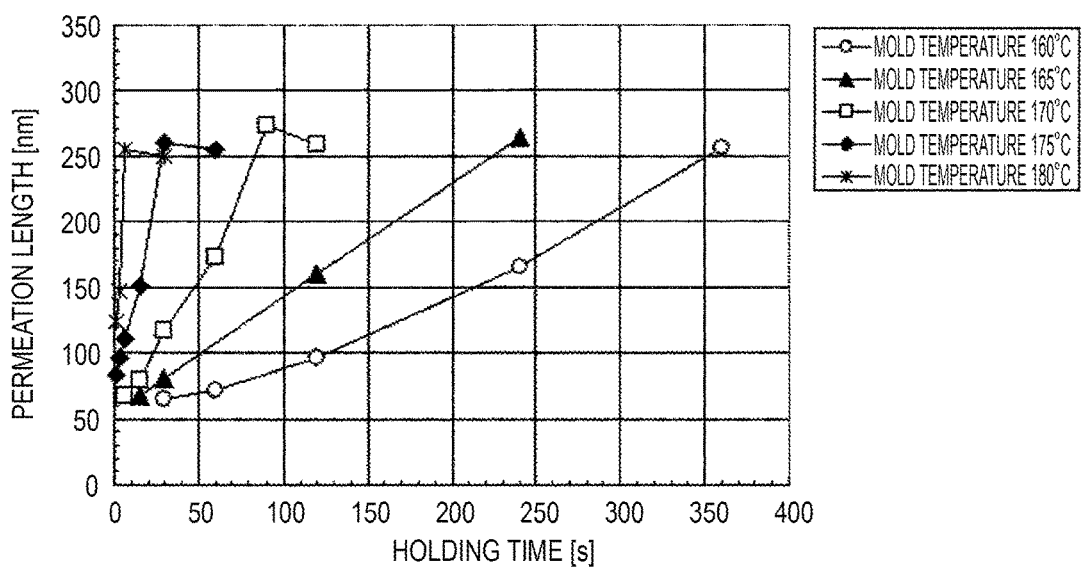
FIG. 7 is a graph showing results of relationship between elapsed time after coating of PARAPET EH1000 (polymethylmethacrylate polymer) and permeation length thereof tested at some mold temperatures in the case where the polymer is coated to a stamper mold and brought into contact therewith.
Figure 8:
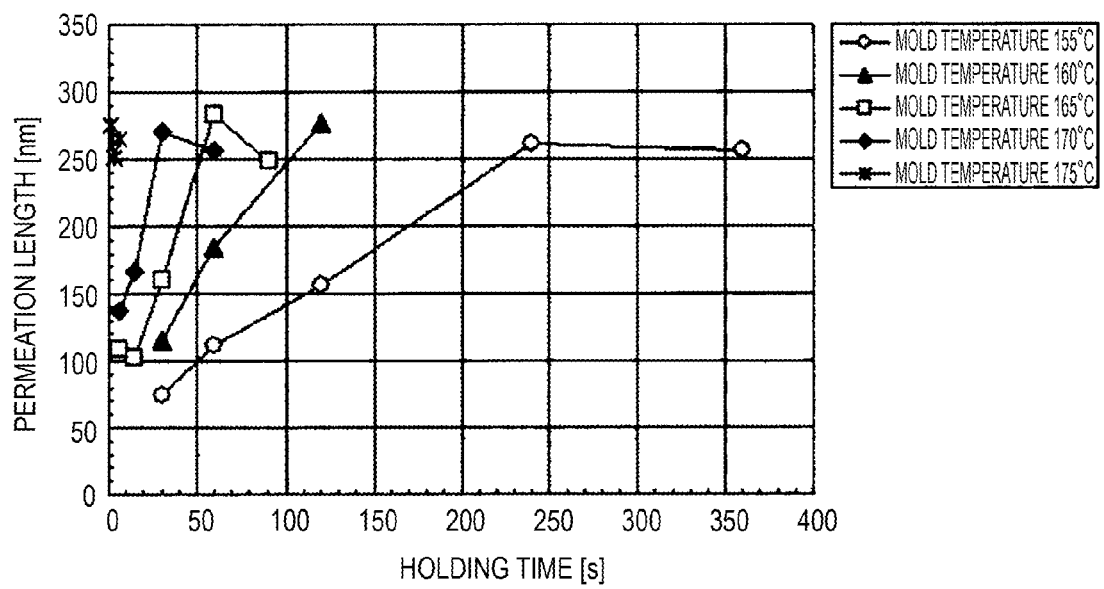
FIG. 8 is a graph showing results of relationship between elapsed time after coating of PARAPET GH1000S (polymethylmethacrylate polymer) and permeation length thereof tested at some mold temperatures in the case where the polymer is coated to a stamper mold and brought into contact therewith.

FIGS. 6 to 8 show results obtained by measuring with a scanning probe microscope permeation length that is height of the fine structure of the molded product transfer-molded under individual conditions and summarizing the relationship between the holding time at each mold temperature and the permeation length. FIG. 6 shows the results of Panlite AD5503, FIG. 7 shows the results of PARAPET EH1000, and FIG. 8 shows the results of PARAPET GH1000s. According to FIG. 6, in the case that the mold temperature is 175° C., it is surmised that the permeation length becomes 250 nm in the case where the holding time is about 15 s, and, when the holding time exceeds 20 s, the permeation length is almost constant. According to the permeation length curve and the results in FIG. 5(b), it is understood that it is sufficient to secure a time required for arrival of the molten polymer at the concave pattern of the fine structure as the holding time. Moreover, according to FIGS. 6 to 8, the permeation length curve has an almost straight-line shape and the permeation length is proportional to the holding time. When the permeation length reaches about 250 nm, it becomes a constant value. The slope of the permeation length curve shows a high dependence on the mold temperature. Thus, the higher the mold temperature is, the larger the slope of the permeation length curve is.

Figure 9:
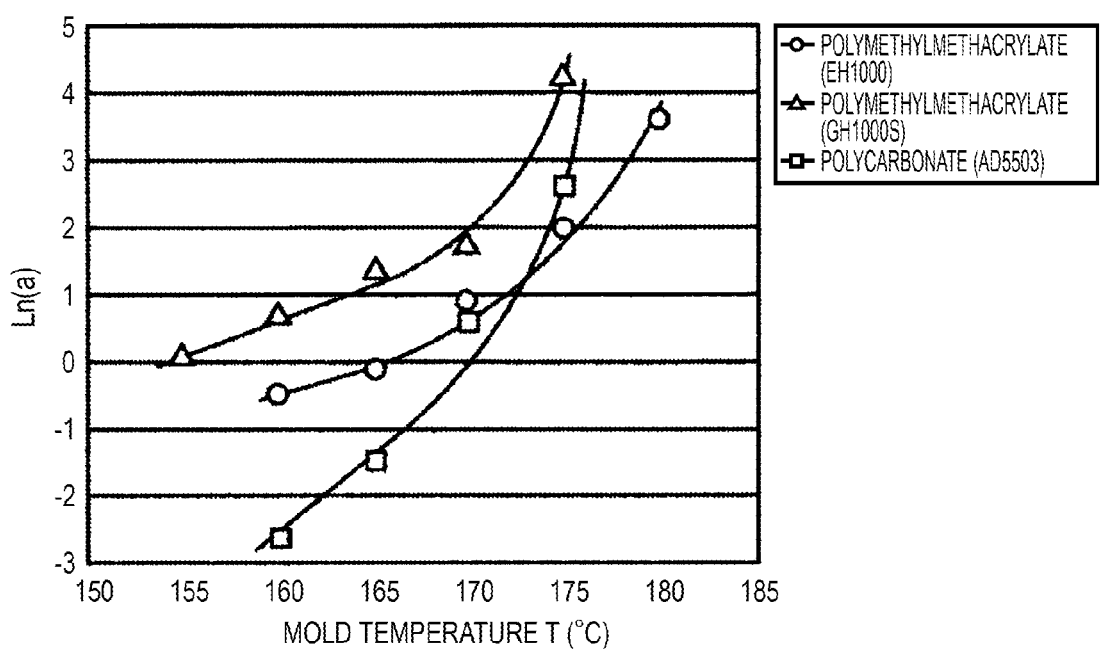
FIG. 9 is a graph showing relationship between slope of permeation length curves shown in FIGS. 6 to 8 and mold temperature.

FIG. 9 is a graph showing the relationship between the slope a of straight-line pattern of the permeation length curve shown in FIGS. 6 to 8 and the mold temperature T. In FIG. 9, the abscissa axis shows the mold temperature T and the ordinate axis shows natural logarithm of the slope a (Ln(a)). According to FIG. 9, each Ln(a) curve has a gentle slope but a shape that is convex downward and thus it is shown that temperature dependence is also high in the Ln (a) curve as in the case of the permeation length curve. Moreover, the two Ln(a) curves in which the material is each a polymethylmethacrylate (EH1000, GH1000s) have resembled shapes and have shapes moved in parallel each other.

On the other hand, the Ln(a) curve in which the material is a polycarbonate (AD5503) has a shape clearly different from the Ln(a) curves of the polymethylmethacrylate (EH1000, GH1000s) and the slope is larger than the slopes of the Ln(a) curves of the polymethylmethacrylate. Namely, the mold temperature dependence of the permeation length is relevant to the kind of the molten polymer and, for efficient manufacture of the molded product with fine structure, it is understood that it is necessary to grasp the mold temperature dependence of the permeation length for each kind of the polymer to be used.

According to the above-described results, it is understood that the permeation length can be increased when the holding time is lengthened, and the permeation length can be increased for a short holding time when the mold temperature is raised. Namely, it is understood that the transfer of the molded product with fine structure of the stamper mold to the molten polymer layer can be efficiently performed by controlling the mold temperature and the holding time. Moreover, in the transfer step, it is understood that management of the mold temperature is important.

Figure 10:
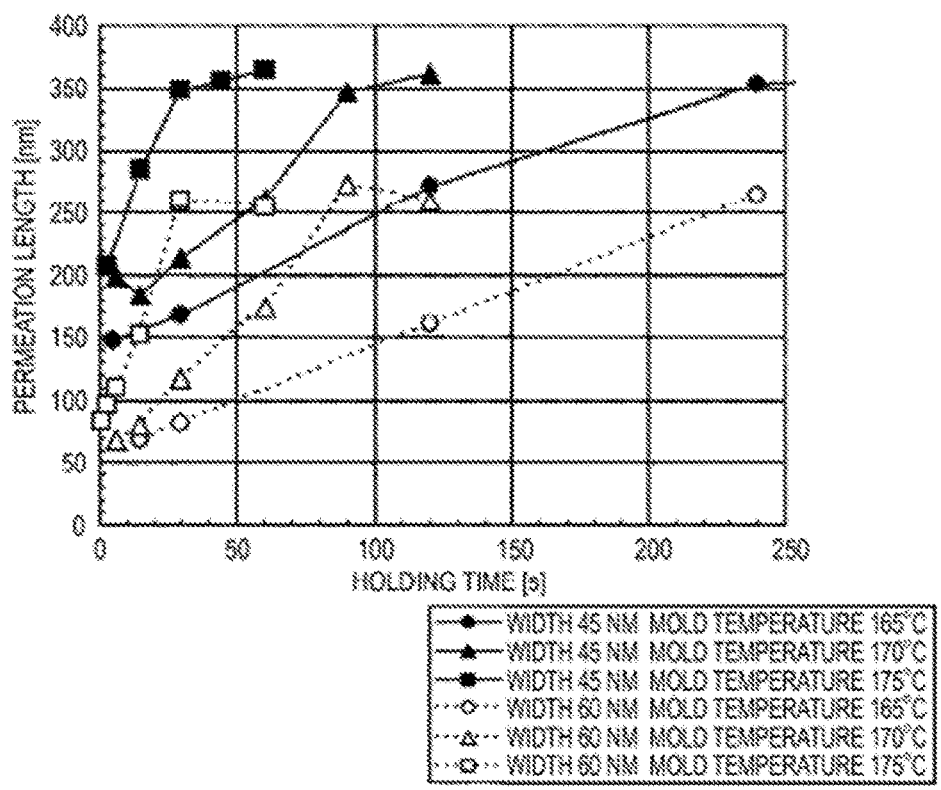
FIG. 10 is a graph showing results of relationship between elapsed time after coating of PARAPET EH1000 and permeation length thereof tested at some mold temperatures in the case where the polymer is coated to two kinds of stamper molds having different shape and disposition of a fine structure and brought into contact therewith.

FIG. 10 shows test results obtained by transfer molding using stamper molds different in the pattern of the fine structure using the low flowability type polymethylmethacrylate (PARAPET EH1000). As the form of the fine pattern, one where columns having a diameter of 250 inn and a height of 250 nm have a gap of a minimum gap of 60 nm and one where columns having a diameter of 250 nm and a height of 380 nm have a gap of a minimum gap of 45 nm are used. In FIG. 10, the abscissa axis shows the holding time and the ordinate axis shows the permeation length that is height of the transfer-molded fine pattern. The legend shows the minimum gap of the fine structure and the mold temperature at the time when transfer molding is performed by the method of the invention. According to FIG. 10, it is understood that there is a difference in the permeation length depending on the difference in the shape and disposition of the pattern even in the case of the same mold temperature and the same holding time. Therefore, it is understood that it is necessary to control the mold temperature and the holding time necessary for complete transfer depending on the size and shape and the disposition of the pattern.

In the above Example, the formation of the molten polymer layer is performed by coating a thermoplastic molten polymer on the upper surface of the fine structure under a coating pressure of 2 MPa or less. However, the thermoplastic molten polymer layer can be brought into contact with the fine structure by closing a mold in the injection compression molding method or by pressing a backup roller, for example, in the film sheet molding method. Moreover, in the blow molding method, the thermoplastic molten polymer layer can be brought into contact with the fine structure by regulating the pressure of the blowing air.

Figure 11:
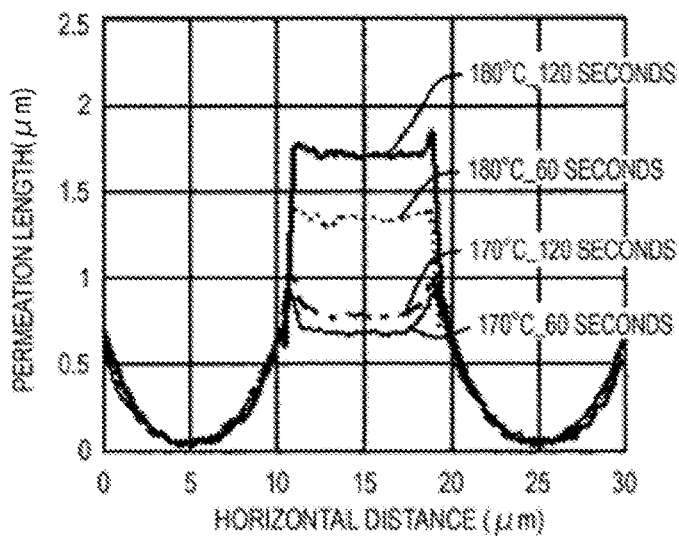
FIG. 11 is a view showing a cross-sectional shape of a micro-structure transferred by coating Panlite AD5503 to a stamper mold having a micro-structure and bringing the polymer into contact therewith.

FIG. 11 shows investigation of the relationship between the mold temperature and the permeation length in the case of molding a molded product with fine structure composed of micro-scaled (micro-structure) Panlite AD5503 in which columns having a diameter of 19 µm, a height of 30 µm, and a pitch of 25 µm stand together in large numbers and shows a cross-sectional shape of the micro-structure transferred to the molded product with fine structure. As the stamper mold, nickel alloy-made one was used. In FIG. 11, the abscissa axis shows the horizontal distance of cross-sectional shape of the micro-structure and the ordinate axis shows the permeation length. The legend of each cross-sectional shape shows the mold temperature and the holding time, and results in the case where each holding time is 60 seconds or 120 seconds at a mold temperature of 170° C. or 180° C.

As shown in FIG. 11, in the molten polymer, a portion coming into contact with the stamper mold (outer peripheral part) tends to be higher than a central portion. Moreover, the permeation length is about 0.7 µm after a lapse of 60 seconds from the coating at a mold temperature of 170° C. and about 1.4 µm after a lapse of 60 seconds from the coating at a mold temperature of 180° C. Thus, when the mold temperature is changed from 170° C. to 180° C., the permeation length is almost doubled. Moreover, the permeation rate is 0.1 µm/min in the case where the mold temperature is 170° C. and is 0.3 µm/min in the case where the mold temperature is 180° C. According to the permeation rate, even when the mold temperature is kept at 180° C., a time of about 30 minutes is required for complete transfer molding of the fine structure and productivity is remarkably decreased. In such a case, it is preferred to take a measure of accelerating the transfer of the micro-structure portion.

Namely, in the case of a fine structure including both of a fine structural pattern in which the width of the concavo-convex pattern is nano-sized and a fine structural pattern in which the width of the concavo-convex pattern is micro-sized, a processing method suitable for each pattern should be adopted. For example, it is appropriate that the nano-sized fine structure is transcribed under gravity and, in the transfer molding of the micro-sized fine structural pattern, the transfer rate is enhanced by pressurization of the molten polymer layer. Here, the nano-sized fine structure means a fine structural pattern chiefly including a concavo-convex pattern having a width of 10 µm to 1 µm. The micro-sized fine structure means a fine structural pattern including a concavo-convex pattern having a width exceeding 1 µm. However, as described above, since the fine structure of a transfer-moldable size varies depending on the kind of the polymer, the disposition of the fine structure, and the like, there may be a case where it is preferred to accelerate the transfer by pressurization even in the case of a submicron-sized fine structure.

The case where the fine structure contains both of the nano-sized fine structure and the micro-sized fine structure includes: a case of a fine structure in which the nano-sized fine structure and the micro-sized fine structure are mixed; a case of a so-called micro and nano fine structure in which a nano-sized structure is further present beyond the edge part of a micro-sized structure; and other cases. In the case of such fine structures, it is appropriate to perform the transfer of the nano-sized fine structure under gravity first and then the transfer of the micro-sized fine structure by pressurization of the molten polymer layer. However, depending on the form of the fine structure, the kind of the polymer to be used, and the like, there may be a case where it is appropriate that the transfer of the micro-sized fine structure is first performed by pressurizing the molten polymer layer and then the transfer of the nano-sized fine structure is performed through holding for a predetermined time. In this case, it is better to keep the pressurization.

In the case of performing the transfer of the nano-sized fine structure and the micro-sized fine structure to the polymer, it is appropriate to utilize the characteristic that the permeation length of the molten polymer is highly dependent on the mold temperature as shown in FIGS. 6 to 10. Namely, it is appropriate to adopt a suitable temperature of the stamper mold in each pattern, thereby preventing the breakage of the stamper mold and also performing efficient transfer.

In the case of performing pressurization in the above invention, the degree thereof may be 0.1 MPa or more and 40 MPa or less. However, a specific degree of pressurization varies depending on the size, shape, and disposition of the fine structure, the kind of the polymer to be used, and the like. Moreover, the pressurization is performed by pressing the molten polymer layer with closing an upper mold in a press-type micro-nano melt transcription molding process. The pressurization can be performed by closing the mold in the injection compression molding method and by, for example, pressing a backup roller in the film sheet molding method. Moreover, in the blow molding method, the pressurization can be achieved by regulating the pressure of the blowing air.

As above, according to the invention, various forms of fine structures can be transfer-molded. Nevertheless, there may be a case where an extremely thick molded product with fine structure is requested. In such a case, after the fine structure is transferred to a thermoplastic molten polymer layer under gravity, it is appropriate that the transfer-molded thermoplastic molten polymer layer is cooled and solidified by temperature control of the stamper mold together with a mold brought into contact with the back surface of the molten polymer layer from the stamper mold, thereby cooling the layer as homogeneously as possible and cooling it rapidly. In this case, it is suitable that the mold brought into contact with the back surface of the molten polymer layer from the stamper mold is put so that a pressurization force of 0.1 to 40 MPa is imparted to the molten polymer layer and the mold follows the shrinkage of the molten polymer layer. Incidentally, the back surface of the molten polymer layer from the stamper mold means a reverse face (back surface) of a face (front surface) on which the fine structure of the molten polymer layer is transferred.

REFERENCE SIGNS LIST

1: Stamper mold
2: Fine structure
5: Molten polymer layer
6: Molded product with fine structure
8: Coating apparatus
9: Polymer discharge port

The invention claimed is:

1. A method for manufacturing a molded product with fine structure, comprising steps of:
in a temperature-controlled stamper mold having a fine structure comprising a concavo-convex pattern having a width of 10 nm to 1 μm, coating a thermoplastic polymer onto the mold by discharging the thermoplastic polymer from a polymer discharge port of a T die while moving the T die over the mold and forming a thermoplastic molten polymer layer to be in contact with the fine structure of the stamper mold having been kept at a predetermined temperature; holding the thermoplastic molten polymer layer for a predetermined time so as to transcribe the fine structure of the stamper mold to the thermoplastic molten polymer layer under gravity so that the nano-sized fine pattern is transcribed to the thermoplastic molten polymer without pressurization by a pressurization apparatus;
cooling and solidifying the transcribed thermoplastic molten polymer layer; and
subsequently releasing the solidified thermoplastic molten polymer layer from the stamper mold.

2. A method for manufacturing a molded product with fine structure, comprising steps of:
in a temperature-controlled stamper mold having a fine structure comprising a concavo-convex pattern having a width of 10 nm to 1 μm, coating a thermoplastic polymer onto the mold by discharging the thermoplastic polymer from a polymer discharge port of a T die while moving the T die over the mold and forming a thermoplastic molten polymer layer to be in contact with the fine structure of the stamper mold having been kept at a predetermined temperature;
holding the thermoplastic molten polymer layer for a predetermined time so as to transcribe the fine structure to the thermoplastic molten polymer layer under gravity so that the nano-sized fine pattern is transcribed to the thermoplastic molten polymer without pressurization by a pressurization apparatus;
cooling and solidifying the transcribed thermoplastic molten polymer layer by temperature control of the stamper mold together with a mold brought into contact with a back surface of the thermoplastic molten polymer layer from the stamper mold; and
subsequently releasing the solidified thermoplastic molten polymer layer from the stamper mold.

3. The method for manufacturing a molded product with fine structure according to claim 2,
wherein pressurization force at the time when the mold is brought into contact with the back surface of the molten polymer layer from the stamper mold is 0.1 to 40 MPa.

4. A method for manufacturing a molded product with fine structure, comprising steps of:
in a temperature-controlled stamper mold provided with a fine structure comprising a fine pattern in which width of a concavo-convex pattern is nano-sized and a fine pattern in which width of a concavo-convex pattern is micro-sized, coating a thermoplastic polymer onto the mold by discharging the thermoplastic polymer from a polymer discharge port of a T die while moving the T die over the mold and forming a thermoplastic molten polymer layer to be in contact with the fine structure of the stamper mold having been kept at a predetermined temperature;
first, holding the thermoplastic molten polymer layer for a predetermined time so as to transcribe the nano-sized fine pattern to the thermoplastic molten polymer layer under gravity so that the nano-sized fine pattern is transcribed to the thermoplastic molten polymer without pressurization by a pressurization apparatus;
second, pressurizing the thermoplastic molten polymer layer so as to transcribe the micro-sized fine pattern to the thermoplastic molten polymer layer to completely transcribe the fine structure;
then, cooling and solidifying the completely transcribed thermoplastic molten polymer layer; and
subsequently releasing the solidified thermoplastic molten polymer layer from the stamper mold.

5. The method for manufacturing a molded product with fine structure according to claim 1,
wherein the formation of the molten polymer layer is performed by coating a thermoplastic molten polymer on an upper surface of the fine structure of the stamper mold under a coating pressure of 2 MPa or less so that a thickness of the polymer to be coated is determined by a distance between a polymer discharge port and the stamper mold and the shape and a thickness of the molten polymer layer become about the same as those of the transcribed final molded product with fine structure.

6. The method for manufacturing a molded product with fine structure according to claim 2,
wherein the formation of the molten polymer layer is performed by coating a thermoplastic molten polymer on an upper surface of the fine structure of the stamper mold under a coating pressure of 2 MPa or less so that a thickness of the polymer to be coated is determined by a distance between a polymer discharge port and the stamper mold and the shape and a thickness of the molten polymer layer become about the same as those of the transcribed final molded product with fine structure.

7. The method for manufacturing a molded product with fine structure according to claim 4, wherein the formation of the molten polymer layer is performed by coating a thermoplastic molten polymer on an upper surface of the fine structure of the stamper mold under a coating pressure of 2 MPa or less so that a thickness of the polymer to be coated is determined by a distance between a polymer discharge port and the stamper mold and the shape and a thickness of the molten polymer layer become about the same as those of the transcribed final molded product with fine structure.

8. The method for method for manufacturing a molded product with fine structure according to claim 1, wherein the discharge port of the T die has a flat tip.

9. The method for method for manufacturing a molded product with fine structure according to claim 2, wherein the discharge port of the T die has a flat tip.

10. The method for method for manufacturing a molded product with fine structure according to claim 4, wherein the discharge port of the T die has a flat tip.

11. The method according to claim 1, wherein the predetermined time for holding the thermoplastic molten polymer layer without mechanically pressing the thermoplastic molten polymer layer is a time period at which a permeation length in a permeation length curve becomes a constant value.

12. The method according to claim 2, wherein the predetermined time for holding the thermoplastic molten polymer layer without mechanically pressing the thermoplastic molten polymer layer is a time period at which a permeation length in a permeation length curve becomes a constant value.

13. The method according to claim 4, wherein the predetermined time for holding the thermoplastic molten polymer layer without mechanically pressing the thermoplastic molten polymer layer is a time period at which a permeation length in a permeation length curve becomes a constant value.

* * * * *